United States Patent
Joseph et al.

(10) Patent No.: US 7,721,182 B2
(45) Date of Patent: May 18, 2010

(54) SOFT ERROR PROTECTION IN INDIVIDUAL MEMORY DEVICES

(75) Inventors: Douglas J. Joseph, Danbury, CT (US); Mark B. Ritter, Sherman, CT (US); José A. Tierno, Stamford, CT (US)

(73) Assignee: International Business Machines Corporation, Armonk, NY (US)

( * ) Notice: Subject to any disclaimer, the term of this patent is extended or adjusted under 35 U.S.C. 154(b) by 707 days.

(21) Appl. No.: 11/140,133

(22) Filed: May 27, 2005

(65) Prior Publication Data

US 2006/0282745 A1   Dec. 14, 2006

(51) Int. Cl.
*G11C 29/00* (2006.01)
(52) U.S. Cl. ........................... 714/766; 714/767
(58) Field of Classification Search ............... 714/769, 714/766, 767
See application file for complete search history.

(56) References Cited

U.S. PATENT DOCUMENTS

| | | | |
|---|---|---|---|
| 6,223,322 B1 * | 4/2001 | Michigami et al. | 714/769 |
| 6,356,555 B1 * | 3/2002 | Rakib et al. | 370/441 |
| 6,466,564 B1 * | 10/2002 | Rakib et al. | 370/342 |
| 6,718,506 B1 * | 4/2004 | Sebastian et al. | 714/763 |
| 6,728,925 B2 * | 4/2004 | Ishiwatari et al. | 714/777 |
| 2003/0115514 A1 * | 6/2003 | Ilkbahar et al. | 714/52 |
| 2005/0229081 A1 * | 10/2005 | Lin et al. | 714/769 |

* cited by examiner

*Primary Examiner*—M. Mujtaba K Chaudry
(74) *Attorney, Agent, or Firm*—Anne V. Dougherty; Ryan, Mason & Lewis, LLP

(57) ABSTRACT

Techniques are disclosed for minimizing the effects of soft errors associated with memory devices that are individually accessible. By way of example, a method of organizing a column in a memory array of a memory device protected by an error correction code comprises the step of maximizing a distance of the error correction code by maximizing a physical distance between memory bits associated with a memory line within the column protected by the error correction code. Other soft error protection techniques may include use of a feed forward error correction code or use of a memory operation (e.g., read or write operation) suppress and retry approach.

20 Claims, 4 Drawing Sheets

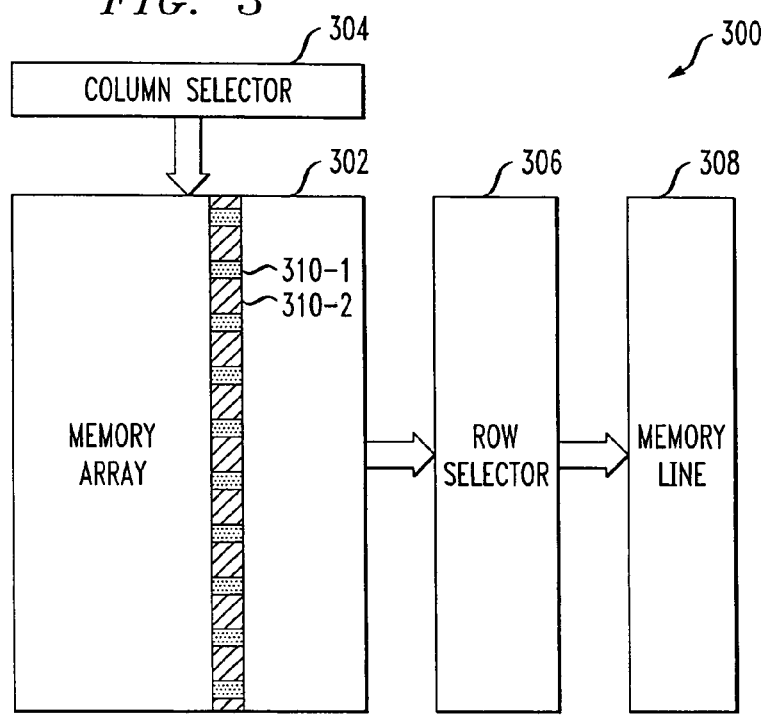
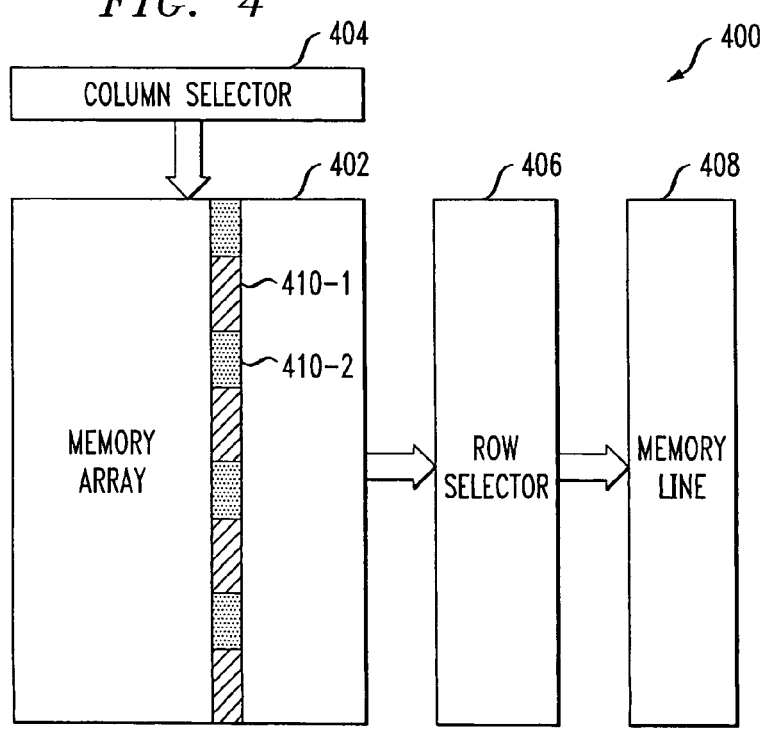

SOFT ERROR PROTECTION IN INDIVIDUAL MEMORY DEVICES

This invention was made with Government support under Contact No.: H98230-04-C-0920 awarded by the National Science Foundation. The Government has certain rights in this invention.

FIELD OF THE INVENTION

This present invention generally relates to memory devices and, more particularly, to techniques for minimizing the effects of soft errors associated with memory devices that are individually accessible.

BACKGROUND OF THE INVENTION

Servers are used in a wide variety of different computing applications. A scalable server is one that can grow to a potentially large number of computing, input/output (I/O) and memory elements. The most extreme examples are super-computer clusters, which are growing toward 100K processors, and millions of dynamic random access memory (DRAM) devices.

For large scale systems such as supercomputing clusters, the soft and hard error rates can have a significant impact on efficiency and usability. As is known, by way of example, a soft error is an error occurrence in a computer's memory system that changes a data value or an instruction in a program. A soft error will not typically damage a system's hardware. The only damage is typically to the data that is being processed. As is also known, by way of example, a hard error is an error occurrence in a computer system that is caused by the failure of a memory chip. Hard errors can appear like chip-level soft errors, but a difference is that the hard error is not typically rectified when the computer is rebooted. The solution to a hard error is typically to replace the memory chip or module entirely.

Failures can occur in many hardware and software components, and careful consideration must be given to all parts of the system to ensure that the mean time between system failures is acceptable. The main (volatile) store in such systems is one of the most critical areas, simply because there are more main store devices than any other type of system component.

Typically the memory devices are DRAM, and the main focus is tolerating soft DRAM data bit failures (e.g., because of their small feature size and sensitivity to soft error mechanisms). However, as the number of DRAM devices in a system grows, other soft failure mechanisms can become a significant system reliability issue.

It is common today even in small computing platforms to protect against soft data bit failures (both DRAM cell and data interface failures). In some high end servers, error protection mechanisms are spread across a number of memory devices (or even dual in-line memory modules or DIMMs), such that the loss of an entire memory device can be tolerated (not unlike Redundant Array of Independent Disks—Level 5 (RAID-5) tolerance to the loss of an entire hard drive). Such schemes typically include address, control, and data signals with error correction codes (ECCs), which has the desirable effect of detecting and recovering from soft failures in address and control interfaces, as well as data interfaces and memory cells.

One downside to this approach is that the smallest unit of transfer between the memory controller and the collection of memory devices can be quite large (e.g., 512 bytes). For some applications, such large block sizes can have a significant adverse impact on run time efficiencies. One class of applications for which this is true is large scale scientific/technical workloads that operate on large, sparse data sets. These workloads are in fact one of the most important for ultra-scale clusters. Hence, the most challenging main store reliability requirement is also the one which would most benefit from fine grain main memory access.

SUMMARY OF THE INVENTION

Principles of the present invention provide techniques for minimizing the effects of soft errors associated with memory devices that are individually accessible.

In a first aspect of the invention, a method of organizing a column in a memory array of a memory device protected by an error correction code comprises the step of maximizing a distance of the error correction code by maximizing a physical distance between memory bits associated with a memory line within the column protected by the error correction code.

In one embodiment, the distance maximizing step may further comprise grouping memory bits associated with a single memory line contiguously together. In another embodiment, the distance maximizing step may further comprise evenly interspersing individual memory bits associated with one memory line between individual memory bits associated with another memory line. In yet another embodiment, the distance maximizing step may further comprise evenly interspersing groups of memory bits associated with one memory line between groups of memory bits associated with another memory line. The memory device may be a dynamic random access memory (DRAM) device.

In a second aspect of the invention, a method of organizing memory lines in memory arrays of an individual memory device comprises the step of physically locating the memory lines in columns of the memory arrays so as to reflect error correcting capabilities of an error correction code used to protect the individual memory device.

In a third aspect of the invention, a method of protecting against one or more soft errors in an individual memory device comprises the steps of obtaining from a memory controller an error correction code generated over at least a portion of address and control signals associated with the memory device, using the error correction code to correct any single bit soft error on the portion of the address and control signals protected by the code, and detecting any multi-bit soft error on the portion of the address and control signals protected by the code. The method may also comprise generating a signal indicative of a detected multi-bit error. The multi-bit error detection signal may be sent to the memory controller so that the memory controller can log a memory location where the multi-bit error occurred.

In a fourth aspect of the invention, a method of protecting against one or more soft errors in an individual memory device comprises the steps of obtaining from a memory controller a parity generated over at least a portion of address and control signals associated with the memory device, using the parity to detect any soft error on the portion of the address and control signals protected by the parity, suppressing an operation to the memory device when a soft error is detected, and retrying the operation. When the operation is a write operation, the write operation may be suppressed to prevent an update to an unintended memory location of the memory device. All intervening operations issued by the memory controller between the error-detected operation and the retry of that operation may be suppressed. In such case, all intervening operations may then be retried.

These and other objects, features and advantages of the present invention will become apparent from the following detailed description of illustrative embodiments thereof, which is to be read in connection with the accompanying drawings.

BRIEF DESCRIPTION OF THE DRAWINGS

FIG. 3 is a block diagram illustrating a bit spread, column organization, according to an embodiment of the present invention;

FIG. 4 is a block diagram illustrating a grouped symbol, column organization, according to an embodiment of the present invention;

DETAILED DESCRIPTION OF PREFERRED EMBODIMENTS

Figure 1:
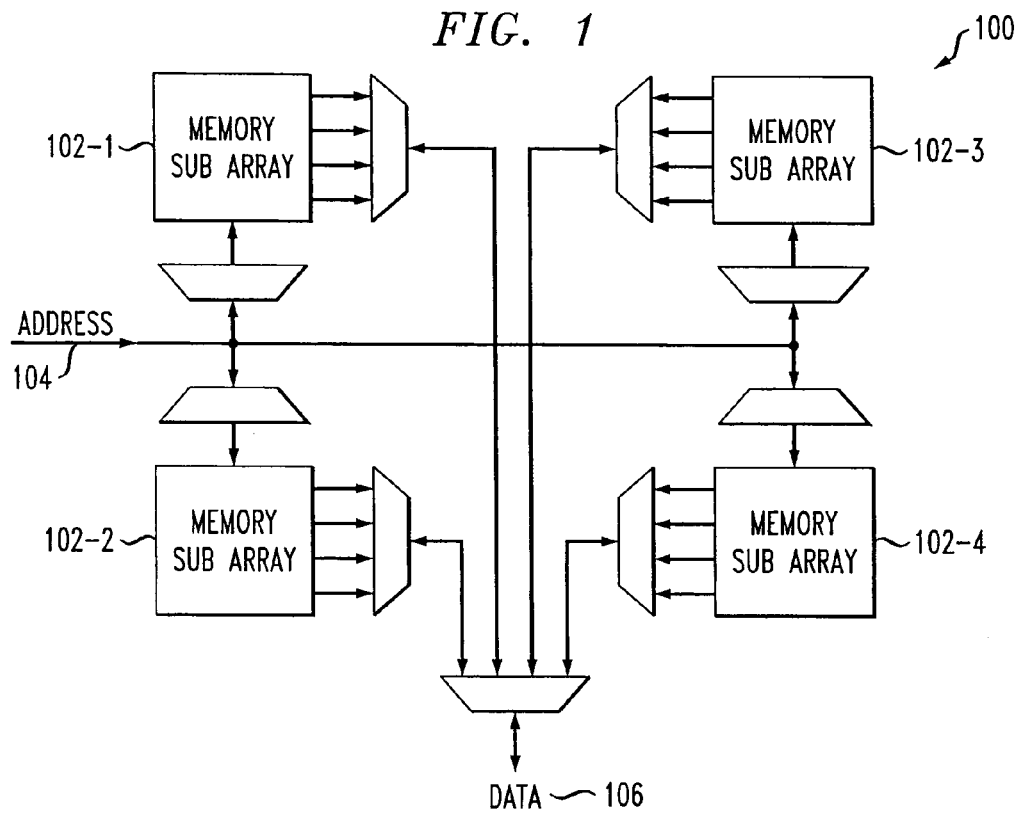
FIG. 1 is a block diagram illustrating a four bank memory organization for use in explaining illustrative principles of the present invention.

While illustrative embodiments of the invention will be described below in the context of DRAM devices, it is to be understood that principles of the invention are not limited to a particular type of memory device. Rather, principles of the invention are applicable to any type of memory device in which it would be desirable to minimize the effect of soft errors.

Since there can be potentially millions of individual memory devices in a large scale supercomputer cluster, soft errors on any of the memory device interfaces should be tolerated to achieve an acceptable mean time between system failures. To support the finest grain access possible, the memory subsystem should be capable of concurrently transferring individual data blocks from individual memory devices. This precludes schemes involving error codes that span multiple memory devices, and dictates that the memory device interface itself should include an appropriate error tolerance mechanism. The device data interface and memory cells should be protected by an error correcting code that spans just the smallest unit of memory transfer (e.g., individual 8 bit data words).

Assuming protection on the data interface for fine grain transfers (e.g., feed forward error correction), consideration is given to the address/control interface. One critical difference between the data and address/control interfaces are the failure modes that can result from soft errors. In particular, a single bit soft error on the data interface during a write can corrupt the target memory location, but the error can be corrected when the data is read back (and subsequently scrubbed). However, a single bit error on the address interface during a write can corrupt an unintended memory location. Furthermore, a soft failure on read/write (R/W) control can turn a read into a write, and corrupt the target memory location in a way that the data interface can not correct.

A main type of soft error is caused by neutrons, alpha particles, etc., hitting the memory device, and generating a large number of electrons in the substrate that can potentially discharge the storage capacitor of a DRAM bit. These errors are locally correlated, since a single event can alter multiple bits, but only in a small area (may be as much as 10 microns across). That is why, in typical memory architectures, symbols are striped across multiple devices to guarantee that multi-symbol errors be uncorrelated.

However, as mentioned above, it may be desirable in certain applications (e.g., large scale scientific/technical workload applications) to use independent access to the DRAM devices in a memory bank to provide very high memory bandwidth. The basic configuration of the memory bank may include multiple DRAM devices, each with a separate command and data channel to a memory hub. One may rely on the independently addressable memory devices within the bank, to deliver very high throughput at a very low granularity (a few bytes per access, rather than hundreds of bytes per access in other architectures).

Though independent access to the memory devices provides the required memory bandwidth, it creates a problem that needs to be addressed to make the memory usable at all. As mentioned, memory lines are usually protected with ECCs. Typically, the memory line is divided into symbols, each symbol representing one or more bits of the line. In a multi-device access architecture, each symbol on a given line is read from a separate device in the memory bank. The ECC is designed so that a number of symbol errors can be corrected or detected as wrong. ECC relies on errors on symbols being statistically uncorrelated. That is, the probability of two symbols on a line being wrong is approximately the square of a single symbol being wrong times the number of bits in the line, and therefore highly unlikely. Thus, in a multi-device access architecture, errors are uncorrelated because each symbol comes from a separate memory device.

However, in a fine grain access architecture (i.e., one where each memory device is individually accessible), the benefits of striping symbols of a line across multiple devices is not realizable. As will be illustratively explained below, principles of the invention provide solutions for these problems.

Referring initially to FIG. 1, a block diagram illustrates how bits may be physically distributed in an illustrative design. As shown, memory device 100 is broken up into sub arrays (102-1 to 102-4 or a four bank memory device). To read a memory line, part of the address 104 is used to select a single sub array (and thus maximize the possible number of concurrent accesses to the memory device). A second part of the address 104 is used to select a column of the sub array, which is read out of the array, potentially going through sense amplifiers and being latched prior to further processing (output data 106). Finally, the remaining part of the address 104 is used to select a subset of the bits in the sub array column. These bits represent the memory line, and are then sent out of the chip in a read operation, or substituted with the write data and then written back (together with the unselected bits) into the sub array column in a write operation.

Some main constraints that memory designers face when deciding on how to do the physical placement of the memory bits in the array are:

(1) Area: Keep wiring at a minimum in various sub array, column, and row decoders, and data multiplexers.

(2) Latency: Make the logic as shallow as possible, trading off access time to larger sub arrays with the extra layers of logic needed to access smaller sub arrays.

(3) Throughput: Allow for the maximum number of concurrent accesses to memory, enabling pipelining and sub array parallelism.

In accordance with principles of the invention, the following two problems are solved:

(1) Read whole memory lines from single devices, to increase memory bank bandwidth.

(2) Guarantee that multi-symbol errors within a memory line are uncorrelated.

Since errors are physically correlated, we place the memory lines in the DRAM arrays to reflect the error correcting capabilities of the ECC that will be used. There are many symbol-oriented ECC schemes (e.g., Reed-Solomon codes) that protect groups of bits. We can, for example, divide a line into groups of four bits, each group representing a hexadecimal symbol, and add parity in the form of extra groups of four bits, so that any error pattern in one of those groups of four bits is correctable, and any error pattern in any two groups of four bits is detectable. This is known as a Single Symbol Correcting, Double Symbol Detecting code or an SSC/DSD ECC.

Thus, in accordance with principles of the invention, we maximize the distance between these symbol groups to minimize the multi-symbol error correlation. The following are illustrative ways that distance can be maximized:

(1) If possible, spread the symbols across multiple bit arrays within the DRAM device.

(2) If possible, spread the word over multiple columns within the array (column=word line).

(3) If more than one symbol falls within the same column, group the bits into symbols, and maximally spread out the symbols in the column. In this case, all the lines that have data on this column will have the symbols interleaved with all the other lines.

By way of example, if a column includes 4K bits and each line includes four four-bit symbols in this column, then:

(1) If we group the bits corresponding to a single line together, then the inter-symbol distance is one DRAM cell. This is illustrated in FIG. 2.

(2) If we spread out the bits evenly, then the inter-symbol distance is 4096/16=256 DRAM cells. This is illustrated in FIG. 3. If this distance is high compared to the maximum soft-error correlation distance (in the order of 10 microns), then this arrangement is optimal in the sense that it minimized the amount of required parity bits (symbols are bits).

(3) If we spread out the symbols, then the inter-symbol distance is 4096/4−3=1021 DRAM cells. This is illustrated in FIG. 4. This arrangement requires more parity bits, but increases the distance between symbols, and thus greatly decreases the correlation of multi-symbol errors.

Figure 2:
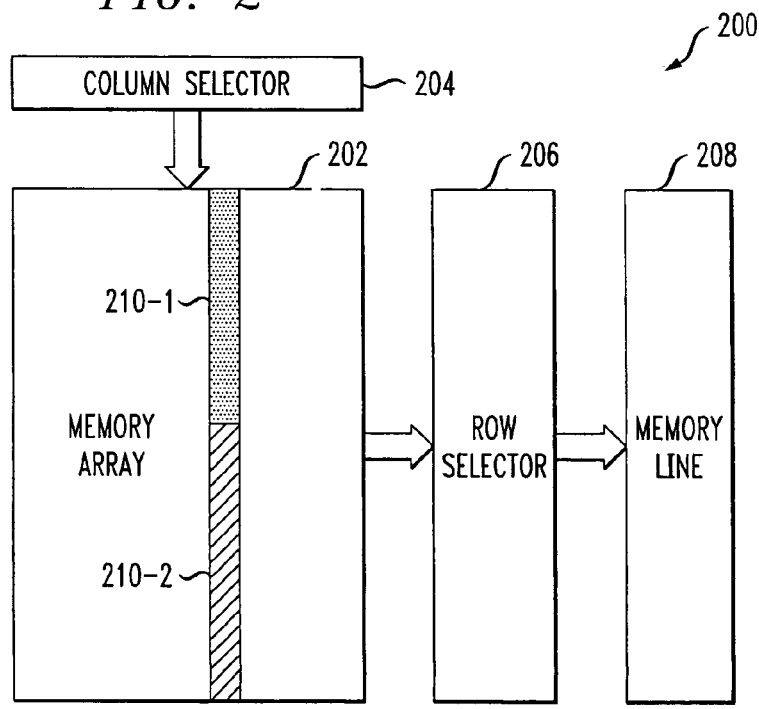
FIG. 2 is a block diagram illustrating a grouped memory line, column organization, according to an embodiment of the present invention.

More particularly referring to FIG. 2, a block diagram illustrates a grouped memory line, column organization, according to an embodiment of the present invention. As shown, memory array 202 (which may be one of the sub arrays 102 illustrated in FIG. 1) is responsive to a column selection signal from column selector 204 and a row selection signal from row selector 206 such that a memory line 208 is read from the array. Since the process of generating column and row selection signals in order to select a memory line of a memory array is well-known to those skilled in the art, details of the signal generation are not further described herein.

As shown in FIG. 2, the bits corresponding to a single line are grouped contiguously together, e.g., the column shown includes two lines 210-1 and 210-2 where the bits for line 210-1 are grouped together, and separate from the grouped bits for line 210-2. Accordingly, the inter-symbol distance is considered one DRAM cell.

More particularly referring to FIG. 3, a block diagram illustrates a bit spread, column organization, according to an embodiment of the present invention. As shown, memory array 302 (which may be one of the sub arrays 102 illustrated in FIG. 1) is responsive to a column selection signal from column selector 304 and a row selection signal from row selector 306 such that a memory line 308 is read from the array.

As shown in FIG. 3, bits for each memory line are spread evenly such that individual memory bits associated with one memory line are evenly interspersed between individual memory bits associated with another memory line. That is, dark-shaded bits (310-1) correspond to one memory line, while hatch-shaded bits (310-2) correspond to another memory line. Thus, in a 4Kbit column, the inter-symbol distance is 256 DRAM cells.

More particularly referring to FIG. 4, a block diagram illustrates a symbol spread, column organization, according to an embodiment of the present invention. As shown, memory array 402 (which may be one of the sub arrays 102 illustrated in FIG. 1) is responsive to a column selection signal from column selector 404 and a row selection signal from row selector 406 such that a memory line 408 is read from the array.

As shown in FIG. 4, symbols (or nibbles) for each memory line are spread evenly such that symbols or nibbles (i.e., groups of memory bits) associated with one memory line are evenly interspersed between symbols or nibbles (i.e., groups of memory bits) associated with another memory line. That is, dark-shaded symbols (410-1) correspond to one memory line, while hatch-shaded symbols (410-2) correspond to another memory line. Thus, in a 4Kbit column, the inter-symbol distance is 1021 DRAM cells.

Thus, as is illustratively described above, the invention provides a method for designing the organization or "floor plan" of a memory array based on the error correcting capabilities of the error correcting code (ECC) used in the memory, whereby the distance of the code is increased by increasing the physical distance between the memory bits protected by the code. Further, a method is provided for designing the ECC code for a memory array so that physically close memory bits are more strongly protected than physically distant memory bits, which is consistent with the idea of maximizing the distance between groups of bits. Still further, a method is provided for distributing memory bits in groups (e.g., nibbles) on a word line in a memory array, so as to maximize the physical distance between those nibbles.

Advantageously, a scheme is provided whereby the physical placement of the cells corresponding to each single line of memory is dictated by the ability of the error correction code to recover those bits. We thus are able to reduce the multi-symbol error correlation by spreading out the symbols in memory.

In accordance with further principles of the invention, two additional methods are provided for handling soft address/control failures in a main memory subsystem designed to handle fine grain accesses: (i) forward error correction; and (ii) error detection and retry.

In the first method, an error correction code (ECC) is generated over the address and control inputs by the memory controller, and passed to the memory device, as will be described in further detail below in the context of FIGS. 5A and 5B. The memory device regenerates the ECC and uses it with the ECC passed to it by the memory controller to correct any single bit address/control errors. If the ECC is a SEC-DED (Single Error Correct, Double Error Detect) code, then all double bit failures (and some greater than double bit failures) are detected and reported back to the memory controller.

Using this approach, the memory subsystem can tolerate any single bit failure on the address/control interface. Note that in this illustrative description, clocks and reference voltages are not considered a protected part of the "control interface." Multi-bit errors are not tolerated, but they are at least detected, which is important for maintaining data integrity in the system. A system restart to a program check point is a heavy-handed approach to recovering from multi-bit failures.

The second method for handling soft errors on the address/control interface involves detecting the error and retrying the memory transaction. In this approach, a simple error detection mechanism such as N bits of parity over M bits of address/control interface can be employed. The memory controller generates parity over the address/control interface and passes it to the memory device. The memory device regenerates the parity and compares it to the parity passed to it by the memory controller. If there is a mismatch between the two sets of parity bits, the memory device generates a parity check signal back to the memory controller in a fixed number of cycles following the cycle in which the address and control signals were driven to the memory device. This is explained in further detail below in the context of FIGS. 6A and 6B.

For write transactions, the memory device suppresses the write operation to prevent an unintentional update to an unintended memory location. To preserve the order of memory accesses, the memory device also suppresses all operations issued by the memory controller between the failed operation and the retry of that operation. All such intervening operations (read or write) are retried, as shown in FIG. 6B.

There are certain trade-offs to consider between the two approaches. The forward error correcting method is simple, but adds more latency to read operations and does not tolerate multi-bit failures. The error detect and retry method is more complex, but has a lower impact on read latency and provides some multi-bit error tolerance. The degree of multi-bit error tolerance could be improved with a stronger error detection code, but at the expense of additional complexity and read latency.

Figure 5A:
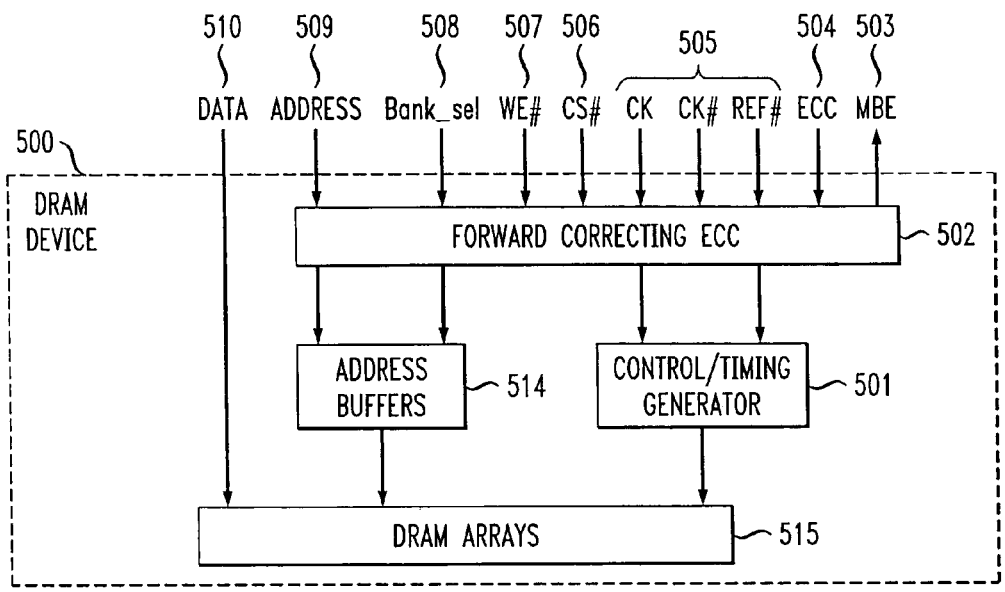
FIG. 5A is a block diagram illustrating a memory device enhanced with forward error correction on the address/control interface, according to an embodiment of the present invention.
Figure 5B:
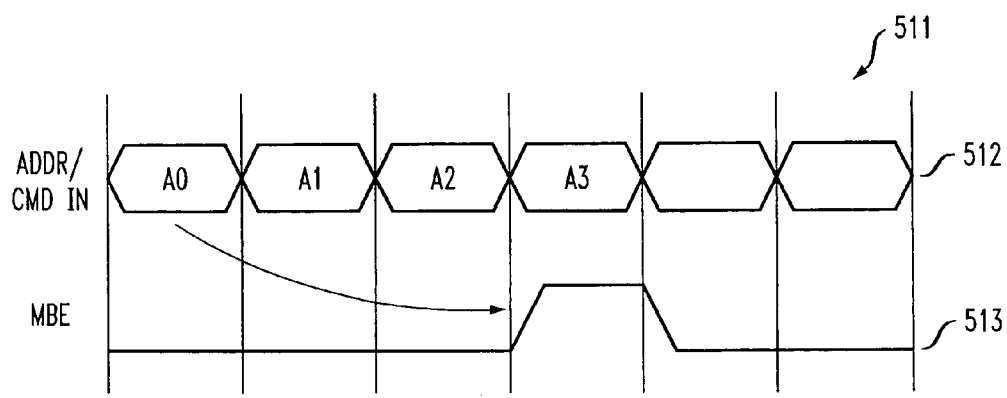
FIG. 5B is a diagram illustrating timing of multi-bit error reporting from a memory device enhanced with forward error correction on the address/control interface, according to an embodiment of the present invention.

Referring now to FIG. 5A, a main memory (DRAM) device 500 enhanced with a forward error correcting mechanism for tolerating soft errors on the address/control interface is depicted. To achieve this purpose, an error correcting code (ECC) 504 generated by the memory controller (not shown) over address and a subset of the control signals 505 to 509 is passed to the memory device. Reference numeral 505 represents clock related signals, from which timing is derived. Reference numeral 506 is chip select, to activate one chip from several connected to the same address/data bus. Reference numeral 507 is write enable, to distinguish between read and write operations. Reference numerals 508 and 509 are the address bus. Data signal lines are collectively referred to as 510, and data is stored in DRAM arrays 515.

The memory device regenerates the ECC and uses the regenerated ECC together with the input ECC 504, to correct any single bit soft error on the address/control inputs in forward correcting ECC block 502 before passing the address/control inputs to the address buffers 514 and control/timing generator 501. The ECC parity is computed from the data and address, and compared with the ECC code that was transmitted over 504. This could be either a Hamming code or a Reed Solomon code, or any other forward error correcting code. Differences between the computed and transmitted ECC codes represent errors in the data or address and the difference between the two is used to correct the bits in error. Details of such operations are well known in the art and thus not further discussed herein.

In the case of a multi-bit failure that the ECC code is able to detect, the memory device generates a multi-bit error (MBE) indication back to the memory controller (signal line 503). As shown in timing diagram 511 of FIG. 5B, the MBE signal (depicted as 513 in FIG. 5B) is generated in a fixed number of cycles (e.g., three cycles) after the memory request (depicted as 512 in FIG. 5B) associated with the MBE signal, so the memory controller can log the memory location where the MBE on the address/control interface occurred.

It is to be understood that where detailed operations of functional blocks shown in FIG. 5A are well-known to those skilled in the art, a further detailed description is not given herein.

Figure 6A:
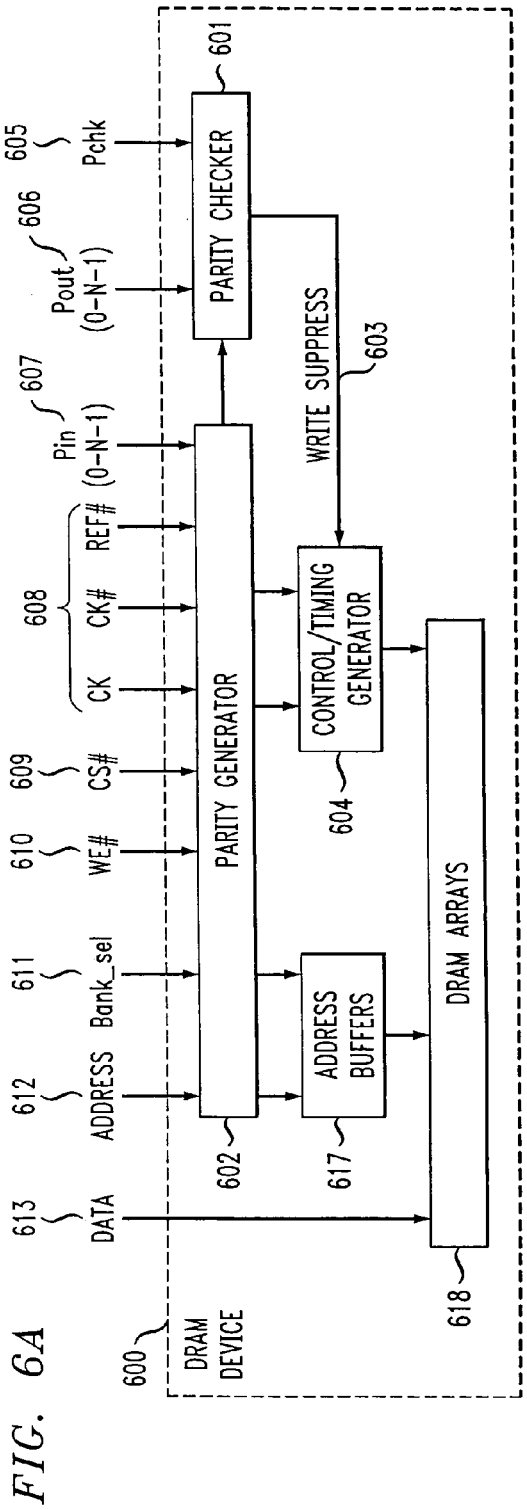
FIG. 6A is a block diagram illustrating a memory device enhanced with parity error detection on the address/control interface and a transaction retry capability, according to an embodiment of the present invention.
Figure 6B:
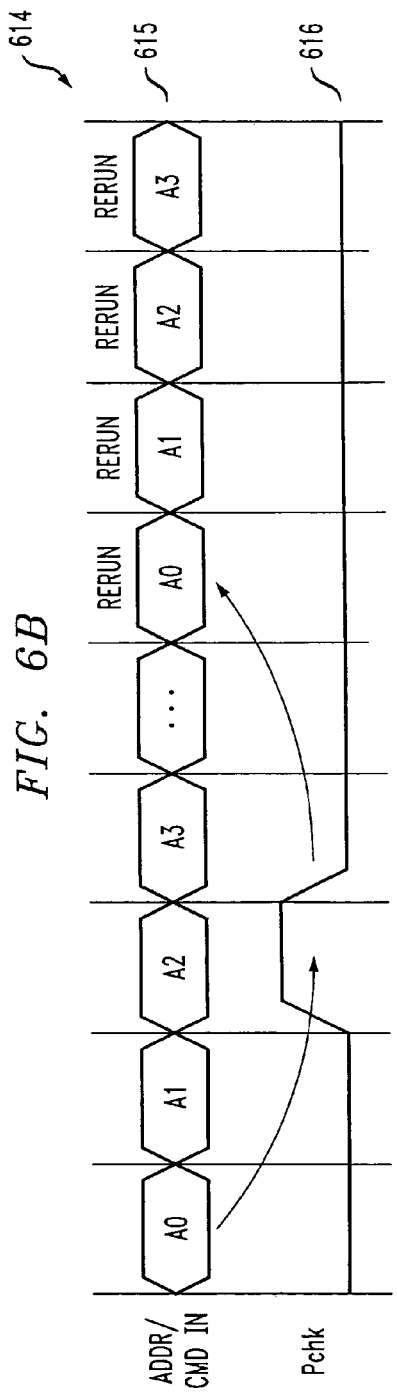
FIG. 6B is a diagram illustrating timing of parity check reporting and transaction retry on a memory device enhanced with parity error detection on the address/control interface and a transaction retry capability, according to an embodiment of the present invention.

FIG. 6A depicts a main memory (DRAM) device 200 enhanced with an error detect and retry mechanism for tolerating soft errors on the address/control interface. To achieve this purpose, N bits of parity 607 are generated by the memory controller (not shown) over M bits of address and a subset of the control signals 608 to 612 and passed to the memory device. Reference numeral 608 represents clock related signals, from which timing is derived. Reference numeral 609 is chip select, to activate one chip from several connected to the same address/data bus. Reference numeral 610 is write enable, to distinguish between read and write operations. Reference numerals 611 and 612 are the address bus. Data signal lines are collectively referred to as 613, and data is stored in DRAM arrays 618.

The memory device regenerates the parity in parity checker 601 and compares it with the input parity 607, to detect any single bit and some multi-bit errors on the address/control inputs 608 to 612. If an error is detected, a 'write suppress' signal 603 is sent to the control/timing generator 604 to suppress the memory write associated with the detected error.

A parity check signal 605 is also passed back to the memory controller. As shown in timing diagram 614 of FIG. 6B, this signal (depicted as 616 in FIG. 6B) is generated in a fixed number of cycles (e.g., two cycles) after the memory request (depicted as 615 in FIG. 6B) associated with it, so the memory controller can identify which memory transaction to retry.

To preserve the order of memory accesses, the memory device also suppresses all operations issued by the memory controller between the failed operation and the retry of that operation. All such intervening operations are retried (as depicted as "Rerun" in 615 of FIG. 6B).

Again, it is to be understood that where detailed operations of functional blocks shown in FIG. 6A are well-known to those skilled in the art, a further detailed description is not given herein.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

What is claimed is:

1. A method of organizing a column in a memory array of a memory device protected by an error correction code, comprising the steps of:
    maximizing a physical distance within the column between groups of one or more memory bits associated with each of a first and a second memory line;
    wherein a number of bits within each group is based at least in part on a number of bits protected by the error correction code;
    wherein each memory line represents one or more bits specified by a corresponding memory address.

2. The method of claim 1, wherein the distance maximizing step further comprises:
    storing the memory bits associated with the first memory line contiguously together within the column; and
    storing the groups associated with the second memory line contiguously together within the column.

3. The method of claim 1, wherein the distance maximizing step further comprises evenly interspersing individual memory bits associated with the first memory line between individual memory bits associated with the second memory line.

4. The method of claim 1, wherein the distance maximizing step further comprises evenly interspersing groups associated with the first memory line between groups associated with the second memory line.

5. The method of claim 1, wherein the memory device is a dynamic random access memory (DRAM) device.

6. A memory device, comprising:
    at least one memory array protected by an error correction code;
    wherein a column of the memory array is organized by maximizing a physical distance within the column between groups of one or more memory bits associated with each of a first and a second memory line;
    wherein a number of bits within each group is based at least in part on a number of bits protected by the error correction code.

7. The memory device of claim 6, wherein the distance maximizing operation further comprises:
    storing the memory bits associated with the first memory line contiguously together within the column; and
    storing the groups associated with the second memory line contiguously together within the column.

8. The memory device of claim 6, wherein the distance maximizing operation further comprises evenly interspersing individual memory bits associated with the first memory line between individual memory bits associated with the second memory line.

9. The memory device of claim 6, wherein the distance maximizing operation further comprises evenly interspersing groups associated with the first memory line between groups associated with the second memory line.

10. The memory device of claim 6, wherein the memory device is a dynamic random access memory (DRAM) device.

11. A method of organizing a given memory line in a memory array of a memory device protected by an error correction code, comprising the steps of:
    distributing a plurality of memory bits associated with the given memory line across a plurality of columns of the memory array; and
    maximizing a physical distance within a given column between groups of one or more memory bits associated with the given memory line, the given column comprising memory bits associated with a plurality of memory lines;
    wherein a number of bits within each group is based at least in part on a number of bits protected by the error correction code;
    wherein each memory line represents one or more bits specified by a corresponding memory address.

12. The method of claim 11, wherein the distance maximizing step further comprises:
    storing the memory bits associated with the memory line contiguously together within the given column; and
    storing the memory bits associated with another memory line contiguously together within the given column.

13. The method of claim 11, wherein the distance maximizing step further comprises evenly interspersing individual memory bits associated with the given memory line between individual memory bits associated with another memory line.

14. The method of claim 11, wherein the distance maximizing step further comprises evenly interspersing groups associated with the given memory line between groups associated with another memory line.

15. The method of claim 11, wherein the memory device is a dynamic random access memory (DRAM) device.

16. A memory device, comprising:
    at least one memory array protected by an error correction code;
    wherein a plurality of memory bits associated with a given memory line are distributed across a plurality of columns of the memory array;
    wherein a given column of the memory array is organized by maximizing a physical distance within the given column between groups of one or more memory bits associated with the given memory line, the given column comprising memory bits associated with a plurality of memory lines; and
    wherein a number of bits within each group is based at least in part on a number of bits protected by the error correction code;
    wherein each memory line represents one or more bits specified by a corresponding memory address.

17. The memory device of claim 16, wherein the distance maximizing operation further comprises:
    storing the memory bits associated with the memory line contiguously together within the given column; and
    storing the memory bits associated with another memory line contiguously together within the given column.

18. The memory device of claim 16, wherein the distance maximizing operation further comprises evenly interspersing individual memory bits associated with the given memory line between individual memory bits associated with another memory line.

19. The memory device of claim 16, wherein the distance maximizing operation further comprises evenly interspersing groups of memory bits associated with the given memory line between groups of memory bits associated with another memory line.

20. The memory device of claim 16, wherein the memory device is a dynamic random access memory (DRAM) device.

* * * * *